United States Patent
Kimura et al.

(10) Patent No.: US 8,247,165 B2
(45) Date of Patent: *Aug. 21, 2012

(54) UPPER LAYER FILM FORMING COMPOSITION FOR LIQUID IMMERSION AND METHOD OF FORMING PHOTORESIST PATTERN

(75) Inventors: Toru Kimura, Tokyo (JP); Yukio Nishimura, Tokyo (JP); Tomohiro Utaka, Tokyo (JP); Hiroaki Nemoto, Tokyo (JP); Atsushi Nakamura, Tokyo (JP); Takashi Chiba, Tokyo (JP); Hiroki Nakagawa, Tokyo (JP)

(73) Assignee: JSR Corporation, Tokyo (JP)

( * ) Notice: Subject to any disclaimer, the term of this patent is extended or adjusted under 35 U.S.C. 154(b) by 1371 days.

This patent is subject to a terminal disclaimer.

(21) Appl. No.: 10/586,187

(22) PCT Filed: Jan. 14, 2005

(86) PCT No.: PCT/JP2005/000346
§ 371 (c)(1),
(2), (4) Date: Jul. 31, 2007

(87) PCT Pub. No.: WO2005/069076
PCT Pub. Date: Jul. 28, 2005

(65) Prior Publication Data
US 2007/0269734 A1 Nov. 22, 2007

(30) Foreign Application Priority Data

Jan. 15, 2004 (JP) ................................ 2004-008466
Jun. 24, 2004 (JP) ................................ 2004-185706
Aug. 10, 2004 (JP) ................................ 2004-233463

(51) Int. Cl.
*G03C 1/00* (2006.01)
*G03F 7/00* (2006.01)
*C08F 18/20* (2006.01)

(52) U.S. Cl. .................. 430/322; 430/270.1; 430/271.1; 430/273.1; 430/326; 526/245

(58) Field of Classification Search ............... 430/270.1, 430/273.1, 322, 271.1, 326; 526/245
See application file for complete search history.

(56) References Cited

U.S. PATENT DOCUMENTS

| | | | |
|---|---|---|---|
| 3,895,949 A | | 7/1975 | Akamatsu et al. |
| 2002/0136979 A1* | | 9/2002 | Miyake et al. ................. 430/156 |
| 2003/0078352 A1 | | 4/2003 | Miyazawa et al. |
| 2003/0118942 A1* | | 6/2003 | Mitsumoto et al. ......... 430/284.1 |
| 2003/0232940 A1* | | 12/2003 | Komoriya et al. ............. 526/242 |
| 2004/0224525 A1* | | 11/2004 | Endo et al. ..................... 438/745 |
| 2005/0266354 A1* | | 12/2005 | Li et al. ......................... 430/322 |

FOREIGN PATENT DOCUMENTS

| | | |
|---|---|---|
| EP | 0583918 | 2/1994 |
| EP | 1365290 | 11/2003 |
| JP | 06-12452 B2 | 2/1994 |
| JP | 09-325500 | 12/1997 |
| JP | 10-017623 | 1/1998 |
| JP | 10-104827 A | 4/1998 |
| JP | 11-124531 | 5/1999 |
| JP | 11-176727 A | 7/1999 |
| JP | 2004-325466 | 11/2004 |
| JP | 2005-157259 | 6/2005 |
| JP | 2006-030603 | 2/2006 |
| JP | 2006-047351 | 2/2006 |
| JP | 2006-091798 | 4/2006 |
| WO | 2004/079453 A1 | 9/2004 |
| WO | WO 2005-050320 | 6/2005 |
| WO | WO 2005-088397 | 9/2005 |

OTHER PUBLICATIONS

Switkes et al., Extending optics to 50 nm and beyond with immersion lithography, Journal of Vacuum Science and Technology: Part B, AVS/AIP, Nov./Dec. 2003, pp. 2794-2799, American Vacuum Society, Melville, NY, US.

Extended European Search Report for corresponding EP Application No. 11154169.4-2222, Mar. 29, 2011.

* cited by examiner

*Primary Examiner* — Cynthia Kelly
*Assistant Examiner* — Connie P Johnson
(74) *Attorney, Agent, or Firm* — Ditthavong Mori & Steiner, P.C.

(57) ABSTRACT

An immersion upper layer film composition is provided which exhibits sufficient transparency for the exposure wavelength 248 nm(KrF) and 193 nm(ArF), can form a protective film on the photoresist film without being intermixed with the photoresist film, is not eluted into water used during immersion exposure to maintain a stable film, and can be easily dissolved in an alkaline developer. The composition applied to coat on the photoresist film when using an immersion exposure device which is irradiated through water provided between a lens and the photoresist film, the composition comprises a resin forming a water-stable film during irradiation and being dissolved in a subsequent developer, and a solvent containing a monovalent alcohol having 6 or less carbon atoms, and the resin contains a resin component having an alcoholic hydroxyl group on the side chain containing a fluoroalkyl group on at least the carbon atom of α-position.

9 Claims, No Drawings

UPPER LAYER FILM FORMING COMPOSITION FOR LIQUID IMMERSION AND METHOD OF FORMING PHOTORESIST PATTERN

TECHNICAL FIELD

The present invention relates to an immersion upper layer film composition useful to form the upper layer film which protects a photoresist and a lens of the projection exposure device without being eluted the photoresist component during immersion exposure used for an essential technology for lithography, and a method of forming photoresist pattern using the upper layer film.

BACKGROUND ART

In the manufacture of semiconductor devices and the like, a stepping or step-and-scan projection exposure device (aligner) has been used in which a pattern of a reticle (photomask) is transferred onto each shot region on a wafer provided with a photoresist through a projection optical system.

The resolution of the projection optical system provided in the projection exposure device increases as the exposure wavelength used becomes shorter and the numerical aperture of the projection optical system becomes greater. Therefore, the exposure wavelength which is the wavelength of radiation used in the projection exposure device has been reduced along with scaling down of integrated circuits, and the numerical aperture of the projection optical system has been increased.

The depth of focus is also important for exposure in addition to the resolution. The resolution R and the depth of focus δ are respectively shown by the following expressions.

$$R = k1 \cdot \lambda / NA \quad \text{(i)}$$

$$\delta = k2 \cdot \lambda / NA^2 \quad \text{(ii)}$$

In the above expressions, λ is the exposure wavelength, NA is the numerical aperture of the projection optical system, and k1 and k2 are process coefficients. When obtaining the same resolution R, a larger depth of focus δ is obtained by using radiation with a shorter wavelength.

In the above case, a photoresist film is formed on the surface of the exposure target wafer, and the pattern is transferred to the photoresist film. In a related-art projection exposure device, the space in which the wafer is placed is filled with air or nitrogen. When the space between the wafer and the lens of the projection exposure device is filled with a medium having a refractive index of n, the resolution R and the depth of focus δ are shown by the following expressions.

$$R = k1 \cdot (\lambda/n) / NA \quad \text{(iii)}$$

$$\delta = k2 \cdot n \lambda / NA^2 \quad \text{(iv)}$$

For example, when using water as the above medium in the ArF process, since water has a refractive index n for light with a wavelength of 193 nm of 1.44, the resolution R is 69.4% ($R = k1 \cdot (\lambda/1.44)/NA$) and the depth of focus is 144% ($\delta = k2 \cdot 1.44\lambda/NA^2$) of the values during exposure using air or nitrogen as the medium.

The above projection exposure method in which the wavelength of exposure radiation is reduced to transfer a more minute pattern is called an immersion exposure method. The immersion exposure method is considered to be an essential technology for lithography with reduced dimensions, particularly for lithography with dimensions of several ten nanometers (Japanese Patent Application Laid-open No. 11-176727).

In the immersion exposure method, both the photoresist film to be applied and to be formed on a wafer and the lens of the projection exposure device respectively contact with water. Therefore, water may permeate the photoresist film, whereby the resolution may be decreased. Moreover, the photoresist components may be eluted (dissolved) in water, thereby causing contamination of the lens surface of the projection optical system.

An upper layer film may be formed on the photoresist film in order to protect the photoresist film from water. The upper layer film which exhibits sufficient transparency for the exposure wavelength, can form a protective film on the photoresist film without being intermixed with the photoresist film, is not eluted into water during immersion exposure to maintain a stable film, and is easily dissolved in an alkaline solution as a developer are demanded.

DISCLOSURE OF THE INVENTION

Problems to be Solved by the Invention

The present invention was achieved in order to solve the above-described problems. An object of the present invention is to provide an immersion upper layer film composition to form the upper layer film which exhibits sufficient transparency for the exposure wavelength, particularly for a KrF excimer laser (wavelength: 248 nm) and an ArF excimer laser (wavelength: 193 nm), can form a protective film on the photoresist without being intermixed with the photoresist film, is not eluted into water used during immersion exposure to maintain a stable film, and can be easily dissolved in an alkaline developer, and a method of forming photoresist pattern.

Means for Solving the Problems

The present invention provides an immersion upper layer film composition applied to coat on a photoresist film when using an immersion exposure device which is irradiated through water provided between a lens and the photoresist film, and the composition comprises a resin forming a water-stable film during irradiation and being dissolved in a subsequent developer, and a solvent containing a monovalent alcohol having 6 or less carbon atoms.

The resin comprises a recurring unit having a fluorine atom-containing group on the side chain.

The recurring unit having a fluorine atom-containing group on the side chain is the recurring unit having an alcoholic hydroxyl group on the side chain containing the fluoroalkyl group on at least the carbon atom of α-position.

The recurring unit having an alcoholic hydroxyl group on the side chain containing the fluoroalkyl group on at least the carbon atom of α-position comprises a recurring unit of the following formula (1).

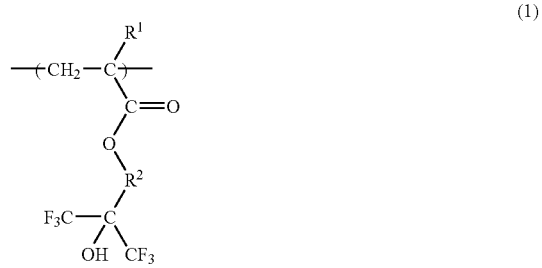

(1)

In the formula (1), $R^1$ represents a hydrogen atom or a methyl group, and $R^2$ represents an organic group.

The present invention also provides a method to form a photoresist pattern comprises the steps of forming a photoresist film by applying the photoresist on a substrate, forming an upper layer film on the photoresist film by using the immersion upper layer film composition, and forming a resist pattern by exposure with radiation through a predetermined mask pattern with water and development.

Effects of the Invention

Since the immersion upper layer film composition to form the upper layer film according to the present invention can be easily applied to a photoresist film. The upper layer film protects a lens and the photoresist film during immersion exposure, and can form a resist pattern with an excellent resolution, developability, and the like. Therefore, the composition is extremely useful in the manufacture of semiconductor devices which are expected to be increasingly scaled down.

BEST MODE FOR CARRYING OUT THE INVENTION

The upper layer film obtained from the composition to form the immersion upper layer film can prevent a photoresist film from contacting directly with water, and not be deteriorated lithography performance of the photoresist film due to permeation of water. Further, it can prevent contamination of the lens of the projection exposure device by the component eluted from the photoresist film.

The resin of the immersion upper layer film composition according to the present invention can form a water-stable film during irradiation and dissolve in a developer to form a resist pattern.

The term "a water-stable film during irradiation" used herein means that a change in the thickness measured by the water-stable evaluation method described later is 0.5% or less of the initial thickness. And the term "dissolve in a developer to form a resist pattern" means that there are no residues by naked eye observation and the upper layer film is removed on the resist pattern after development. Thus, the resin according to the present invention is an alkali-soluble resin which is scarcely soluble in water but is soluble in an alkaline aqueous solution during development using the alkaline aqueous solution.

The alkali-soluble resin forming a water-stable film during irradiation and being dissolved in a subsequent developer contains recurring units. As the recurring units, a recurring unit having a carboxyl group, a recurring unit having a phenol site, and a recurring unit having a fluorine atom-containing group on the side chain, in which the recurring unit having an alcoholic hydroxyl group on the side chain containing the fluoroalkyl group on at least the carbon atom of α-position is preferable, can be given. The recurring units can be contained either individually or in combinations of two or more.

As a radical polymerizable monomers forming the recurring unit having a carboxyl group, unsaturated monocarboxylic acids such as (meth)acrylic acid, crotonic acid, cinnamic acid, atropic acid, 3-acetyloxy(meth)acrylic acid, 3-benzoyloxy (meth)acrylic acid, α-methoxy acrylic acid, and 3-cyclohexyl(meth)acrylic acid; unsaturated polycarboxylic acids such as fumaric acid, maleic acid, citraconic acid, mesaconic acid, and itaconic acid; monoesters such as monomethyl ester of the unsaturated monocarboxylic acid, monoethyl ester, mono n-propyl ester, and mono n-butyl ester; 2-(meth)acrylamide-2-methylpropanecarboxylic acid, 2-α-carboxyacrylamide-2-methylpropanecarboxylic acid, 2-α-carboxymethylacrylamide-2-methylpropanecarboxylic acid, 2-α-methoxycarbonylacrylamide-2-methylpropanecarboxylic acid, 2-α-acetyloxyacrylamide-2-methylpropanecarboxylic acid, 2-α-phenylacrylamide-2-methylpropanecarboxylic acid, 2-α-benzylacrylamide-2-methylpropanecarboxylic acid, 2-α-methoxyacrylamide-2-methylpropanecarboxylic acid, 2-α-cyclohexylacrylamide-2-methylpropanecarboxylic acid, 2-α-cyanoacrylamide-2-methylpropanecarboxylic acid, and the like can be given.

Of these monomers, (meth)acrylic acid and crotonic acid are preferable.

As a radical polymerizable monomers forming the recurring unit having a phenolic site, hydroxystyrene derivatives such as p-hydroxystyrene, m-hydroxystyrene, o-hydroxystyrene, α-methyl-p-hydroxystyrene, α-methyl-m-hydroxystyrene, α-methyl-o-hydroxystyrene, 2-allylphenol, 4-allylphenol, 2-allyl-6-methylphenol, 2-allyl-6-methoxyphenol, 4-allyl-2-methoxyphenol, 4-allyl-2,6-dimethoxyphenol, and 4-allyloxy-2-hydroxybenzophenone; hydroxystyrene(meth) acrylamide derivatives such as 4-hydroxyphenyl(meth)acrylamide, 4-hydroxy-3,5-dimethyl(meth)acrylamide, 2-hydroxyphenyl(meth)acrylamide, 2-hydroxy-3-methylphenyl (meth)acrylamide, 2-hydroxy-5-methylphenyl(meth) acrylamide, 2-hydroxy-3,5-dimethylphenyl (meth) acrylamide, 4-hydroxy-cyclohexyl(meth)acrylamide, 2-hydroxy-cyclohexyl (meth)acrylamide, and the like can be given.

Of these monomers, p-hydroxystyrene, α-methylhydroxystyrene and 4-hydroxyphenyl(meth)acrylamide are preferable.

As the recurring unit having a fluorine atom-containing group on the side chain, the recurring unit having an alcoholic hydroxyl group on the side chain containing a fluoroalkyl group on at least the carbon atom of α-position is particularly preferable.

As the fluoroalkyl group in the recurring unit having an alcoholic hydroxyl group on the side chain containing a fluoroalkyl group on at least the carbon atom of α-position, a trifluoromethyl group is preferable. When the recurring unit contains at least one fluoroalkyl group on the α-position, a hydrogen atom of the alcoholic hydroxyl group tends to be left by electron withdrawing of the fluoroalkyl group and presents acidity in the aqueous solution, whereby it becomes insoluble in pure water but becomes alkali-soluble. As the example of the recurring unit, the recurring unit of the formula (1) can be given.

In the formula (1), $R^1$ represents a hydrogen atom or a methyl group, and it can be used both of them.

$R^2$ of the formula (1) represents an organic group and preferably a divalent hydrocarbon group. As the divalent hydrocarbon group, linear or cyclic hydrocarbon group are preferable.

As a preferable example of the $R^2$, methylene group, ethylene group, propylene groups such as 1,3-propylene group and 1,2-propylene group; saturated linear hydrocarbon groups such as tetramethylene group, pentamethylene group, hexamethylene group, heptamethylene group, octamethylene group, nonamethylene group, decamethylene group, undecamethylene group, dodecamethylene group, tridecamethylene group, tetradecamethylene group, pentadecamethylene group, hexadecamethylene group, heptadecamethylene group, octadecamethylene group, nonadecamethylene group, icosa methylene group, 1-methyl-1,3-propylene group, 2-methyl-1,3-propylene group, 2-methyl-1,2-propylene group, 1-methyl-1,4-butylene group, 2-methyl-1,4-butylene group, methylidene group, ethylidene group, and propylidene group; monocyclichydrocarbon cyclic groups such as cycloalkylene groups having 3-10 carbon atoms such as 1,3-cyclobutylene group, cyclopentylene groups such as 1,3-cyclopentylene group, cyclohexylene groups such as 1,4-cyclohexylene group, cyclooctylene groups such as 1,5-cyclooctylene group; closs-linking cyclichydrocarbon cyclic groups such as hydrocarbon cyclic groups having 2 to 4 carbocycles and 4-30 cyclic carbon atoms such as norbornylene groups such as 1,4-norbornylene group and 2,5-norbornylene group, adamantylene groups such as 1,5-adamantylene group and 2,6-adamantylene group; and the like can be given.

In particular, when an alicyclic hydrocarbon group is contained as $R^2$, it is preferable to insert an alkylene group having 1-4 carbon atoms as spacer between a bistrifluoromethyl-hydroxy-methyl group and the alicyclic hydrocarbon group.

As examples of the formula (1), preferable $R^2$ is a hydrocarbon group having 2,5-norbornylene group or 1,2-propylene group. As preferable examples of the radical polymerizable monomers of the above formula (1), following formulas (M-1) to (M-3) can be given.

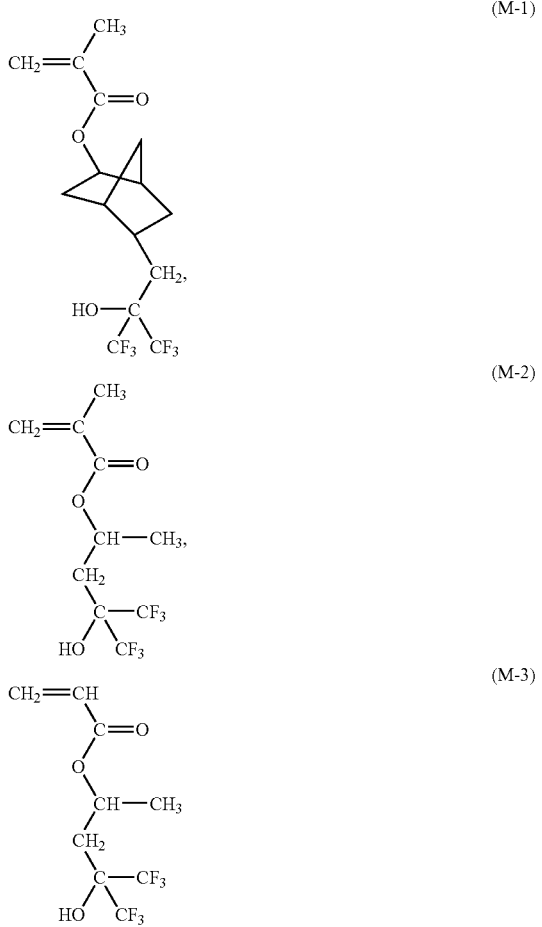

As the recurring unit having a fluorine atom-containing group on the side chain other than the recurring unit having an alcoholic hydroxyl group on the side chain, a recurring unit having a fluoroalkyl group on the side chain is preferable. The recurring unit can be obtained by copolymerizing fluoroalkyl (meth) acrylate. The recurring unit is added in order to control the refractive index of the upper layer film.

As the preferable example of a fluoroalkyl(meth) acrylate monomers, fluoroalkyl(meth)acrylates containing fluoroalkyl group having 1-20 carbon atoms such as difluoromethyl (meth) acrylate, perfluoromethyl(meth)acrylate, 2,2-difluoroethyl(meth)acrylate, 2,2,2-trifluoroethyl(meth)acrylate, perfluoroethyl(meth)acrylate, 1-(perfluoromethyl)ethyl (meth)acrylate, 2-(perfluoromethyl)ethyl(meth)acrylate, 2,2,3,3-tetrafluoropropyl(meth)acrylate, perfluoroethylmethyl (meth)acrylate, di(perfluoromethyl)methyl(meth)acrylate, perfluoropropyl(meth)acrylate, 1-methyl-2,2,3,3-tetrafluoropropyl(meth)acrylate, 1-(perfluoroethyl)ethyl(meth)acrylate, 2-(perfluoroethyl)ethyl(meth)acrylate, 2,2,3,3,4,4-hexafluorobutyl(meth)acrylate, perfluoropropylmethyl (meth)acrylate, perfluorobutyl(meth)acrylate, 1,1-dimethyl-2,2,3,3-tetrafluoropropyl(meth)acrylate, 1,1-dimethyl-2,2,3,3,3-pentafluoropropyl(meth)acrylate, 2-(perfluoropropyl) ethyl(meth)acrylate, 2,2,3,3,4,4,5,5-octafluoropentyl(meth) acrylate, perfluorobutylmethyl(meth)acrylate, perfluoropentyl(meth)acrylate, 1,1-dimethyl-2,2,3,3,4,4-hexafluorobutyl(meth)acrylate, 1,1-dimethyl-2,2,3,3,4,4,4-heptafluorobutyl(meth)acrylate, 2-(perfluorobutyl)ethyl (meth)acrylate, 2,2,3,3,4,4,5,5,6,6-decafluorohexyl(meth) acrylate, perfluoropentylmethyl(meth)acrylate, perfluorohexyl(meth)acrylate, 1,1-dimethyl-2,2,3,3,4,4,5,5-octafluoropentyl(meth)acrylate, 1,1-dimethyl-2,2,3,3,4,4,5,5,5-nonafluoropentyl(meth)acrylate, 2-(perfluoropentyl) ethyl(meth)acrylate, 2,2,3,3,4,4,5,5,6,6,7,7-dodecafluoroheptyl(meth)acrylate, perfluorohexylmethyl(meth)acrylate, perfluoroheptyl(meth)acrylate, 2-(perfluorohexyl)ethyl (meth)acrylate, 2,2,3,3,4,4,5,5,6,6,7,7,8,8-tetradecafluorooctyl(meth)acrylate, perfluoroheptylmethyl(meth)acrylate, perfluorooctyl(meth)acrylate, 2-(perfluoroheptyl)ethyl (meth)acrylate, 2,2,3,3,4,4,5,5,6,6,7,7,8,8,9,9-hexadecafluorononyl(meth)acrylate, perfluorooctylmethyl (meth)acrylate, perfluorononyl(meth)acrylate, 2-(perfluorooctyl)ethyl(meth)acrylate, 2,2,3,3,4,4,5,5,6,6,7,7,8,8,9,9,10,10-octadecafluorodecyl(meth)acrylate, perfluorononylmethyl(meth)acrylate, perfluorodecyl(meth)acrylate, 2,2,3,3,4,4,4-hexafluorobutyl (meth)acrylate, 2,2,3,3,4,4,4-heptafluorobutyl(meth)acrylate, 3,3,4,4,5,5,6,6,6-nonafluorohexyl(meth)acrylate, and 3,3,4,4,5,5,6,6,7,7,8,8,8-tridodecafluorooctyl(meth)acrylate; (2,2,2-trifluoroethyl)α-carboxyacrylate, (perfluoroethylmethyl)α-carboxyacrylate, (2,2,2-trifluoroethyl)α-carboxymethylacrylate, (perfluoroethylmethyl)α-carboxymethylacrylate, (2,2,2-trifluoroethyl) α-methoxycarbonylacrylate, (perfluoroethylmethyl)α-methoxycarbonylacrylate, (2,2,2-trifluoroethyl)α-acetyloxyacrylate, (perfluoroethylmethyl)α-acetyloxyacrylate, (2,2,2-trifluoroethyl)α-phenylacrylate, (perfluoroethylmethyl)α-phenylacrylate, (2,2,2-trifluoroethyl)α-benzylacrylate, (perfluoroethylmethyl)α-benzylacrylate, (2,2,2-trifluoroethyl)α-ethoxyacrylate, (perfluoroethylmethyl)α-ethoxyacrylate, (2,2,2-trifluoroethyl)α-2-methoxyethylacrylate, (perfluoroethylmethyl)α-2-methoxyethylacrylate, (2,2,2-trifluoroethyl)α-cyclohexylacrylate, (perfluoroethylmethyl)α-cyclohexylacrylate, (2,2,2-trifluoroethyl)α-cyanoacrylate, (perfluoroethylmethyl)α-cyanoacrylate, 3[4[1-trifluoromethyl-2,2-bis[bis(trifluoromethyl)fluoromethyl]ethinyloxy] benzoyloxy]2-hydroxypropyl(meth)acrylate, (2,2,3,3,3-pentafluoropropyl)2-phenylacrylate, (2,2,3,3,3-pentafluoropropyl)2-benzylacrylate, (2,2,3,3,3-pentafluoropropyl)2-ethoxyacrylate, (2,2,3,3,3-pentafluoropropyl)2-cyclohexylacrylate, (2,2,3,3,3-pentafluoropropyl)2-cyanoacrylate, and the like can be given. These fluoroalkyl group-containing monomers can be used either individually or in combination of two or more.

As the fluoroalkyl group-containing monomers of the present invention, fluoroalkyl(meth)acrylates having fluoroalkyl group consisting of 1-20 carbon atoms is preferable. Of these, perfluoroalkyl(meth)acrylate and fluoroalkyl(meth) acrylates in which a perfluoroalkyl group is bonded to an ester oxygen atom through a methylene group, an ethylene group, or a sulfonylamino group are more preferable.

It is preferable to copolymerize other radical polymerizable monomers to the alkali-soluble resin of the present invention in order to control, for example, the molecular weight, glass transition point of the resin. The term "other" used herein refers to radical polymerizable monomers other than the above-mentioned radical polymerizable monomers. And acid-labile group-containing monomers can be copolymerized.

As the other radical polymerizable monomers or acid-labile group-containing monomers, (meth)acrylic alkyl esters, (meth)acrylic aryl esters, dicarboxylic acid esters, nitrile group-containing radical polymerizable monomers, amide bond-containing radical polymerizable monomers, aliphatic vinyls, chlorine-containing radical polymerizable monomers, conjugated diolefin, hydroxyl group-containing (meth)acrylic alkyl esters, and the like can be given. As examples of the monomers, (meth)acrylic alkyl esters such as methyl(meth)acrylate, ethyl(meth)acrylate, n-butyl(meth)acrylate, sec-butyl(meth)acrylate, tert-butyl(meth)acrylate, isopropyl(meth)acrylate, n-hexyl(meth)acrylate, cyclohexyl(meth)acrylate, 2-methylcyclohexyl(meth)acrylate, dicyclopentanyloxyethyl(meth)acrylate, isobornyl(meth)acrylate, dicyclopentanyl(meth)acrylate, methoxy dipropylene glycol(meth)acrylate, butoxy dipropylene glycol(meth)acrylate, methoxy ethylene glycol(meth)acrylate, methoxy propylene glycol(meth)acrylate, 2-methyl-2-adamantyl(meth)acrylate, 2-ethyl-2-adamantyl(meth)acrylate, 2-propyl-2-adamantyl(meth)acrylate, 2-butyl-2-adamantyl(meth)acrylate, 1-methyl-1-cyclohexyl(meth)acrylate, 1-ethyl-1-cyclohexyl(meth)acrylate, 1-propyl-1-cyclohexyl(meth)acrylate, 1-butyl-1-cyclohexyl(meth)acrylate, 1-methyl-1-cyclopentyl(meth)acrylate, 1-ethyl-1-cyclopentyl(meth)acrylate, 1-propyl-1-cyclopentyl(meth)acrylate, 1-butyl-1-cyclopentyl(meth)acrylate, 1-adamantyl-1-methylethyl(meth)acrylate, and 1-bicyclo[2.2.2]heptyl-1-methylethyl(meth)acrylate; dicarboxylic acid esters such as diethyl maleate, diethyl fumarate, and diethyl itaconate; (meth)acrylic aryl esters such as phenyl(meth)acrylate, benzyl(meth)acrylate; aromatic vinyls such as styrene, α-methylstyrene, m-methylstyrene, p-methylstyrene, vinyl toluene, and p-methoxystyrene; nitrile group-containing radical polymerizable monomers such as acrylonitrile and methacrylonitrile; amide bond-containing radical polymerizable monomers such as acrylamide, methactrylamide, and trifluoromethanesulfonyl aminoethyl (meth)acrylate; aliphatic vinyls such as vinyl acetate; chlorine-containing radical polymerizable monomers such as vinyl chloride and vinylidene chloride; conjugated diolefins such as 1,3-butadiene, isoprene, and 1,4-dimethylbutadiene can be given.

As examples of the hydroxyl group-containing(meth)acrylic alkyl esters, 2-hydroxyethyl(meth)acrylate, 3-hydroxypropyl(meth)acrylate, 2-hydroxypropyl(meth)acrylate, 2-hydroxybutyl(meth)acrylate, 2,3-dihydroxypropyl(meth)acrylate, polypropylene glycol(meth)acrylate, 2-hydroxycyclohexyl(meth)acrylate, 4-hydroxycyclohexyl(meth)acrylate, 3-hydroxy-1-adamantyl(meth)acrylate, 3,5-dihydroxy-1-adamantyl(meth)acrylate, and the like can be given. Of these, 2-hydroxyethyl(meth)acrylate and 3-hydroxy-1-adamantyl(meth)acrylate are preferable.

These monomers can be used either individually or in combination of two or more.

It is preferable that an alkali-soluble resin according to the present invention is a resin containing a recurring unit having fluorine atoms-containing group on the side chain.

As the recurring unit having fluorine atoms-containing group on the side chain, a recurring unit having an alcoholic hydroxyl group on the side chain containing a fluoroalkyl group on at least the carbon atom of α-position and/or a recurring unit having a fluoroalkyl group on the side chain are preferable. In particular, the alkali-soluble resin containing a recurring unit having an alcoholic hydroxyl group on the side chain containing a fluoroalkyl group on at least the carbon atom of α-position is preferable.

When the resin contains the recurring unit having a fluoroalkyl group on the side chain independently, it is preferable that an acid-labile group-containing recurring unit is contained as resin component. It is also preferable that an acid-labile group-containing recurring unit is contained as resin component when a recurring unit having a group is contained no fluorine atoms on the side chain. Since the recurring unit contains the acid-labile group, the resin being dissolved in a developer after irradiation can be obtained.

When the resin contains the recurring unit having an alcoholic hydroxyl group on the side chain containing a fluoroalkyl group on at least the carbon atom of α-position as the alkali-soluble resin component, the amount of the component is preferably 10 wt % or more, more preferably 20 wt % or more, and particularly preferably 30 wt %. If the amount of the component is less than 10 wt %, the solubility in an alkaline solution as a developer may be decreased. Thus, the upper layer film may not be removed, and the residues are remained on the resist pattern after development.

When the resin contains the recurring unit having a fluoroalkyl group on the side chain as the alkali-soluble resin component, the amount of the component is 90 wt % or less. If the amount of the component exceeds 90 wt %, the solubility in a monovalent alcohol having 6 or less carbon atoms may be significantly decreased and can not be prepared as the upper layer film composition. Or, the solubility in an alkaline solution as a developer may be decreased, and may not be completely removed the upper layer film after development. Both of the defects may occur at the same time.

When the resin contains the recurring unit having a carboxyl group as the alkali-soluble resin component, the content of the carboxyl group is usually 3 wt % to 50 wt %, preferably 3 wt % to 40 wt %, and particularly preferably 3 wt % to 30 wt %. If the content is less than 3 wt %, the solubility in an alkaline solution as a developer may be decreased. Thus, the upper layer film may not be removed, and the residues are remained on the resist pattern after development. If the content of the recurring unit is more than 50 wt %, the stability to waterduring immersion exposure may be decreased, and the contents may be eluted into water and contaminated the lens of the projection optical system.

When the resin does not contain the recurring unit having a carboxyl group as the alkali-soluble resin component, the total content of the recurring unit having a phenol site and the recurring unit having an alcoholic hydroxyl group on the side chain containing a fluoroalkyl group on the carbon atom of α-position is usually 20 wt % or more, preferably 30 wt % or more, and particularly preferably 40 wt % or more. If the content of the recurring unit is less than 20wt %, the solubility in an alkaline solution as a developer may be decreased. Thus, the upper layer film may not be removed, and the residues are remained on the resist pattern after development. If the content of the recurring unit is excessively, the stability to water during immersion exposure may be decreased, and the contents may be eluted into water and contaminated the lens of the projection optical system.

The radical polymerizable monomers having a carboxyl group on the side chain or having a phenol site can copolymerize to the alkali-soluble resin in order to control the solubility in the developer.

It is preferable that the amount of the units derived from the radical polymerizable monomers having a phenol site be less than 20 wt %, because the site has a large absorption of light at a wavelength of 193 nm when using for ArF exposure.

The amount of the units derived from the other radical polymerizable monomers or the acid-labile group-containing monomers; (1) when the resin contains the recurring unit having a carboxyl group as the alkali-soluble resin component, the content of the units are usually 20 wt % or more, preferably 30 wt % or more, and particularly preferably 40 wt % or more; (2) when the resin does not contain the recurring unit having a carboxyl group as the alkali-soluble resin component, the content of the units are usually 80 wt % or less, preferably 70 wt % or less, and particularly preferably 60 wt % or less.

As the polymerization solvent used in the preparation for alkali-soluble resin, alcohols such as methanol, ethanol, 1-propanol, 2-propanol, 1-butanol, 2-butanol, ethylene glycol, diethylene glycol, and propylene glycol; cyclic ethers such as tetrahydrofuran and dioxane; alkyl ethers of polyhydric alcohols such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethylmethyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate, and the like can be given. Of these, cyclic ethers, alkyl ethers of polyhydric alcohol, alkyl ether acetates of polyhydric alcohol, ketones, and esters are preferable.

As the solvent for the radical copolymerization, an appropriate radical polymerization initiator can be used. As examples of the solvents, azo compounds such as 2,2'-azobisisobutyronitrile, 2,2'-azobis(methyl 2-methylpropionate), 2,2'-azobis(2,4-dimethylvaleronitrile), 2,2'-azobis(4-methoxy-2-dimethylvaleronitrile); organic peroxides such as benzoyl peroxide, lauroyl peroxide, tert-butylperoxy pivalate, and 1,1'-bis(tert-butylperoxy)cyclohexane, and also hydrogen peroxide. In the case of using peroxide as a radical polymerization initiator, this may be combined with a reducing agent so as to form a redox-type initiator.

A polystyrene-reduced weight average molecular weight (hereinafter referred to as "Mw") of the alkali-soluble resin obtained by the above manner determined by gel permeation chromatography (GPC) is 2,000 to 100,000, preferably 2,500 to 50,000, and still more preferably 3,000 to 20,000. If the Mw of the alkali-soluble resin is less than 2,000, water resistance as an upper layer film and mechanical properties may be significantly decreased. If the Mw exceeds 100,000, solubility in solvent described later may be significantly decreased. The ratio of Mw to the polystyrene-reduced number molecular weight (hereinafter referred to as "Mn") determined by gel permeation chromatography (GPC) (Mw/Mn) of the resin is usually 1-5, and preferably 1-3.

It is. preferable that the resin have a low content of the impurities such as halogen, metal, and the like. As a result, it may be further improved the applicability as the upper layer film and the uniform solubility in an alkaline developer. As a method of the purification method for the resin, for example, washing with water or a chemical purification method such as a liquid-liquid extraction and the like can be given. Moreover, the chemical purification method can use the combination of a physical purification method ultrafiltration method, centrifugation, and the like. In the present invention, the resins can be used either individually or in combinations of two or more.

As solvents for the immersion upper layer film composition according to the present invention, the solvents that can dissolve the alkali-soluble resin, and dose not deteriorate lithography performance during applying to the photoresist film with being intermixed with the photoresist film, can be used.

As the solvent, a solvent containing a monovalent alcohol having 6 or less carbon atoms can be given. As examples of the solvents, methanol, ethanol, 1-propanol, isopropanol, n-propanol, 1-butanol, 2-butanol, 2-methyl-2-propanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, and the like can be given. Of these, ethanol and isopropanol are preferable, and isopropanol is particularly preferable. These monovalent alcohols having 6 or less carbon atoms can be used either individually or in combination of two or more.

In terms of safety grounds especially boiling point or flash point, 2-propanol, 1-butanol, 2-butanol, 2-methyl-2-pentanol, 3-methyl-2-pentanol, and 4-methyl-2-pentanol are preferable.

Other solvents may be appropriately added to the alkali-soluble resin composition in order to control the applicability when applying the upper layer film to the photoresist film. The other solvents can be uniformly applied the upper layer film without being eroded the photoresist film.

As the other solvent, polyhydric alcohols such as ethylene glycol and propylene glycol; cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethylmethyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate; and water can be given. Of these, cyclic ethers, alkyl ethers of polyhydric alcohol, alkyl ether acetates of polyhydric alcohol, ketones, esters, and water are preferable.

The amount of the other solvent is 30 wt % or less, preferably 20 wt % or less in the solvent component. If the amount of the other solvent exceeds 30 wt %, the other solvent erodes the photoresist film, occurs the problem such as intermixing between the photoresist film and the upper layer film, thereby causing it significantly deteriorates the resolution of the photoresist.

Surfactants exhibiting an action of improving the applicability, anti-foaming ability and levering ability may optionally be added to the immersion upper layer film composition of the present invention.

As the surfactant, fluorochemical surfactant can be used. As examples of the surfactants, commercially available products such as BM-1000, BM-1100 (manufactured by BM Chemie Co.), MEGAFAC F142D, F172, F173,F183 (manufactured by Dainippon Ink and Chemicals, Inc.), Fluorad FC-135, FC-170C, FC-430, FC-431 (manufactured by Sumitomo 3M Ltd.), Surflon S-112, S-113, S-131, S-141, S-145 (manufactured by Asahi Glass Co., Ltd.), SH-28PA, SH-190, SH-193, SZ-6032, SF-8428 (manufactured by Toray and Dow Coming Corp.) can be given.

The amount of surfactants to be added is usually 5 parts by weight or less for 100 parts by weight of the alkali-soluble resin.

The method of forming photoresist pattern according to the present invention is described below.

A photoresist is applied to a substrate to form a photoresist film. As the substrate, a silicon wafer, an aluminum-coated wafer, or the like may be used in the step of forming a photoresist film applied to a substrate. In order to bring out the potential of the resist film, an organic or inorganic antireflection film may be formed on the substrate as disclosed in JP-B-6-12452, for example.

The photoresist used is not particularly limited, and may be appropriately selected depending on the purpose of the resist. As examples of the resist, a positive-tone or negative-tone chemically-amplified resist containing an acid generator can be given.

When using the immersion upper layer film which formed by composition according to the present invention, the positive-tone resist is preferable. In the chemically-amplified positive-tone resist, an acid-labile organic group in the polymer dissociates by the action of an acid generated from the acid generator upon exposure to produce a carboxyl group, for example. As a result, the exposed portion of the resist exhibits increased solubility in an alkaline developer and is dissolved in and removed by an alkaline developer, whereby a positive-tone resist pattern is obtained.

The photoresist film is formed by dissolving a resin composition to form the photoresist film in an appropriate solvent to a solid content of 0.1 to 20 wt %, filtering the solution through a filter with a pore size of about 30 nm to obtain a resist solution, applying the resist solution to a substrate using an appropriate coating method such as rotational coating, cast coating, or roll coating, and prebaking (hereinafter abbreviated as "PB") the applied resist solution to volatilize the solvent. In this case, a commercially available resist solution may be directly used.

A step of forming the upper layer film using the immersion upper layer film composition is the step by applying the immersion upper layer film composition of the present invention to the photoresist film, and usually baking again to form the immersion upper layer film of the present invention. In this step, the immersion upper layer film is formed in order to protect the photoresist film and prevent contamination of the lens of the projection exposure device by the component eluted from the photoresist film.

A reflex inhibition effect at the interface on the resist film tends to be increased by closing the thickness of the upper layer film to odd-numbered fold of $\lambda/4m$ ($\alpha$: wavelength of radiation; m: refractive index of the upper layer film). Therefore, it is preferable to bring the thickness of the upper layer film closer to the value. In the present invention, one of the treatments of prebaking after applying the resist solution and baking after applying the upper layer film composition can be cut to simplify the steps.

A resist pattern is formed by applying radiation to the photoresist film and the immersion upper layer film is formed using water as a medium through a mask having a specific pattern, and developing the photoresist film. In this step, the photoresist film is subjected to immersion exposure, baked at a specific temperature, and developed.

Water filled between the photoresist film and the upper layer film can be adjusted pH. In particular, pure water is preferable.

As the radiation used for immersion exposure, various types of radiation such as visible light; ultraviolet rays such as g-line and i-line; far ultraviolet rays such as an excimer laser light; X-rays such as synchrotron radiation; and charged particle rays such as electron beams may be selectively used depending on the photoresist film used and the combination of the photoresist film and the immersion upper layer film. In particular, it is preferable to use light from an ArF excimer laser (wavelength: 193 nm) or a KrF excimer laser (wavelength: 248 nm).

It is preferable to perform post exposure baking (hereinafter abbreviated as "PEB") in order to provide the resist film with improved resolution, pattern profile, developability, and the like. The baking temperature is usually about 30 to 200° C., and preferably 50 to 1 50° C., although the baking temperature is appropriately adjusted depending on the resist used and the like.

The photoresist film is then developed using a developer and washed to form a desired resist pattern. In this case, the immersion upper layer film is not demanded to perform a removal treatment separately. The film is removed completely by washing during or after development. That is one of important characteristic of the present invention.

As the alkaline developer when forming a resist pattern according to the present invention, an alkaline aqueous solution prepared by dissolving sodium hydroxide, potassium hydroxide, sodium carbonate, sodium silicate, sodium metasilicate, ammonia, ethylamine, n-propylamine, diethylamine, di-n-propylamine, triethylamine, methydiethylamine, dimethylethanolamine, triethanolamine, tetramethyl ammonium hydroxide, tetraethyl ammonium hydroxide, pyrrole, piperidine, choline, 1,8-diazabicyclo[5.4.0]-7-undecene, 1,5-diazabicyclo[4.3.0]-5-nonane, and the like. A water-soluble organic solvent, for example alcohols such as methanol, ethanol or the like, or a surfactant may be appropriately added to the developer. When the photoresist film is developed using the alkaline aqueous solution, the film is usually washed with water after development.

EXAMPLES

Resin Synthesis Example 1

Resins (A-1) to (A-8) which form a water-stable film during irradiation and be dissolved in a developer after forming a resist pattern were prepared using the following method. And comparative resin (A-32) was prepared using the following method. The Mw and Mn of the resins (A-1) to (A-8) and comparative resin (A-32) were measured by gel permeation chromatography (GPC) using GPC columns (manufactured by Tosoh Corp., G2000H$_{XL}$×2, G3000H$_{XL}$×1, G4000H$_{XL}$×1) under the following conditions. Flow rate: 1.0 ml/minute, eluate: tetrahydrofuran, column temperature: 40° C., standard reference material: monodispersed polystyrene As the monomer other than the monomers (M-1) to (M-3) given above, monomers (M-4) to (M-14) of the following formula are given.

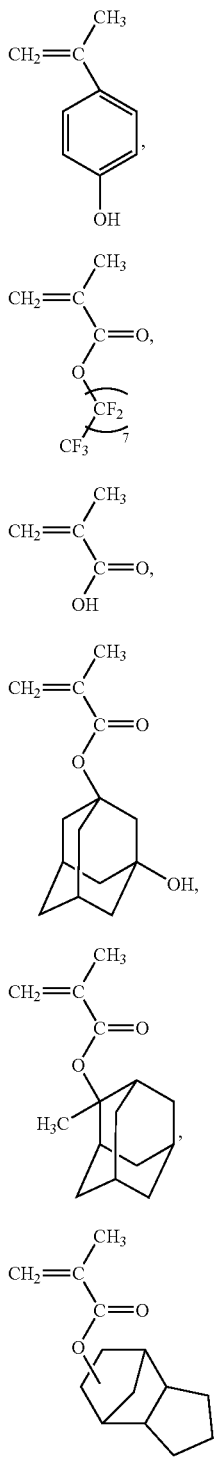

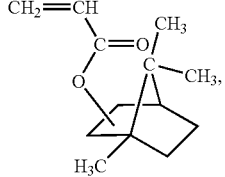

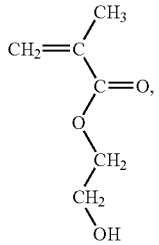

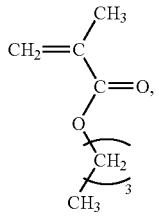

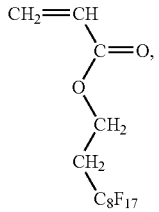

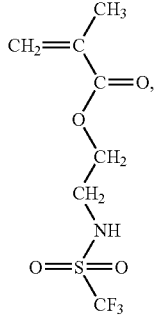

A homogenous monomer solution was prepared by dissolving 50 g of the monomer (M-1), 5 g of the monomer (M-6), 25 g of the monomer (M-1 1), 20 g of the monomer (M-12), and 6.00 g of 2,2'-azobis-(methyl 2-methyl propionate) in 200 g of methyl ethyl ketone. A 1,000 ml three-neck flask charged with 100 g of methyl ethyl ketone was purged with nitrogen gas for 30 minutes. After purging with nitrogen, the contents of the flask were heated to 80° C. with stirring. The monomer solution prepared in advance was added dropwise to the flask using a dripping funnel at a rate of 10 ml per five minutes. The monomers were polymerized for five hours after initiation of the addition (i.e. polymerization start time). After completion of polymerization, the reaction solution was cooled to 30° C. or less and poured into 2,000 g of heptane, and the precipitated white powder was separated by filtration.

The separated white powder was mixed with 400 g of heptane to prepare a slurry, and the slurry was stirred. After performing this operation twice, the slurry was washed, separated by filtration, and dried at 50° C. for 17 hours to obtain a white powdery resin (A-1) (89 g; yield: 89 wt %). The resin (A-1) had a molecular weight (Mw) of 7,300.

The resins ware prepared by the same manner shown the compositions in Table 1. The yield and Mw of each resin are shown in Table 1. The unit of the Table 1 is gram (g).

Post-treatment Method (1):

The polymer solution was added dropwise to 3,000 g of n-heptane over 20 minutes using a dripping funnel with stirring. The polymer solution was stirred for another one hour. The resulting slurry solution was then filtered using a Buchner funnel. The separated white powder was added to 600 g of n-heptane with stirring to prepared slurry solution, and again filtered using a Buchner funnel. The resulting powder was dried at 50° C. for 24 hours in the vacuum drier. Mw, Mw/Mn (dispersity of molecular weight) and yield (wt %) of the resulting powder were measured. The results are shown in Table 2.

TABLE 1

| Resin | M-1 | M-2 | M-3 | M-4 | M-5 | M-6 | M-7 | M-8 | M-9 | M-10 | M-11 | M-12 | Mw | Yield(%) |
|---|---|---|---|---|---|---|---|---|---|---|---|---|---|---|
| A-1 | 50 | — | — | — | — | 5 | — | — | — | — | 25 | 20 | 7300 | 89 |
| A-2 | 70 | — | — | — | — | — | — | 20 | — | — | 10 | — | 6800 | 88 |
| A-3 | — | 40 | — | — | 20 | 5 | — | — | 35 | — | — | — | 6400 | 86 |
| A-4 | — | 60 | — | — | — | — | 30 | — | — | — | 10 | — | 6800 | 86 |
| A-5 | — | 80 | — | — | — | — | — | — | — | 10 | 10 | — | 7400 | 87 |
| A-6 | — | — | 60 | — | — | — | 10 | 20 | — | — | 10 | — | 7100 | 84 |
| A-7 | — | — | — | — | 50 | 20 | 30 | — | — | — | — | — | 7200 | 83 |
| A-8 | — | — | — | 70 | 10 | — | — | — | — | — | 20 | — | 6800 | 81 |
| A-32 | — | — | — | — | 50 | — | 10 | — | — | — | 40 | — | 7900 | 87 |

Resin Synthesis Example 2

Resins (A-9) to (A-3 1) were prepared in proportions (units; gram (g)) shown in Table 2.

A monomer solution was prepared by dissolving monomers and initiators (2,2'-azobis-(methyl 2-methyl propionate)) shown in Table 2 in 200 g of isopropanol. A 1,500 ml three-neck flask equipped with a thermometer and a dripping funnel was charged with 100 g of isopropanol, and purged with nitrogen gas for 30 minutes. After purging with nitrogen, the contents of the flask were heated to 80° C. with stirring using magnetic stirrer. The monomer solution was then added to dropwise to the flask over three hours using a dripping funnel. After completion of dropwise, the reaction was further continued for another three hours. The solution was cooled to 30° C. or less and a polymer solution was obtained.

Post-treatment was conducted by the "post-treatment method (1)" and "post-treatment method (2)" of resins (A-9) to (A-18) and resins (A-19) to (A-3 1) respectively. Each method was carried out as follows.

Post-Treatment Method (2):

The polymer solution was concentrated until reduced by 200 g, poured into a separating funnel with 200 g of methanol and 1600 g of n-heptane, stirred sufficiently, and separated the liquid of lower layer. The liquid of lower layer was added to 200 g of methanol and 1600 g of n-heptane, and again separated the lower layer liquid using a separating funnel. The resulting lower layer liquid was carried out a solvent substitution into 1-butanol or 4-methyl-2-pentanol. A solid content of the sample was calculated based on the weight of the residue which was obtained by heating 0.3 g of the resin solution on the aluminum plate using the hotplate at 140° C. for two hours. The calculated value was used for the subsequent preparation of the upper layer film solution and calculation of the yield. Mw, Mw/Mn (dispersity of molecular weight) and yield (wt %) of the resulting resin solution were measured. The results are shown in Table 2.

TABLE 2

| Resin | M-1 | M-2 | M-3 | M-6 | M-7 | M-8 | M-9 | M-10 | M-11 | M-13 | M-14 | Initiator | Mw | Mw/Mn | Yield(%) |
|---|---|---|---|---|---|---|---|---|---|---|---|---|---|---|---|
| A-9 | 17.7 | — | — | 12.7 | 69.6 | — | — | — | — | — | — | 9.0 | 7800 | 2.30 | 95 |
| A-10 | — | 14.9 | — | 13.1 | 72.0 | — | — | — | — | — | — | 9.3 | 6800 | 1.82 | 98 |
| A-11 | — | — | — | 13.5 | 74.2 | 12.3 | — | — | — | — | — | 9.6 | 7500 | 1.88 | 93 |
| A-12 | — | — | — | 13.6 | 74.8 | — | 11.6 | — | — | — | — | 9.7 | 6900 | 1.87 | 94 |
| A-13 | — | — | — | 11.8 | 64.6 | — | — | — | — | 23.6 | — | 8.4 | 7000 | 1.82 | 78 |
| A-14 | — | — | — | 9.4 | 34.3 | — | — | — | — | 56.4 | — | 6.7 | 6600 | 1.55 | 70 |
| A-15 | — | — | — | 13.3 | 73.2 | — | — | — | — | — | 13.5 | 9.5 | 7600 | 2.00 | 97 |
| A-16 | — | 41.4 | — | 8.1 | 44.4 | — | — | — | 6.1 | — | — | 8.6 | 7300 | 1.81 | 95 |
| A-17 | 47.3 | — | — | 11.3 | 41.4 | — | — | — | — | — | — | 8.1 | 8200 | 2.00 | 80 |
| A-18 | — | — | — | 21.0 | 57.6 | — | 13.4 | — | 7.9 | — | — | 11.2 | 7100 | 1.90 | 90 |
| A-19 | — | 67.8 | — | — | 27.2 | — | — | 5.0 | — | — | — | 7.1 | 8000 | 1.77 | 84 |
| A-20 | — | — | — | 14.2 | — | — | — | — | — | 85.8 | — | 6.1 | 6500 | 1.85 | 70 |
| A-21 | — | 83.3 | — | — | 16.7 | — | — | — | — | — | — | 6.5 | 8100 | 1.77 | 80 |
| A-22 | — | 65.1 | — | — | 34.9 | — | — | — | — | — | — | 6.8 | 8500 | 1.71 | 83 |
| A-23 | 34.4 | 65.6 | — | — | — | — | — | — | — | — | — | 5.9 | 7800 | 1.94 | 81 |
| A-24 | — | 88.3 | — | — | — | — | 11.7 | — | — | — | — | 6.5 | 6800 | 1.84 | 78 |
| A-25 | — | 87.7 | — | — | — | 12.3 | — | — | — | — | — | 6.5 | 6200 | 1.82 | 84 |
| A-26 | — | 76.3 | — | — | — | — | — | — | — | 23.7 | — | 5.6 | 6300 | 1.69 | 76 |
| A-27 | — | 50.6 | — | 14.8 | — | 34.5 | — | — | — | — | — | 9.1 | 7200 | 1.72 | 81 |
| A-28 | — | 77.5 | — | — | — | 17.6 | — | 4.9 | — | — | — | 6.9 | 7700 | 1.90 | 85 |
| A-29 | — | — | 73.6 | — | — | 26.4 | — | — | — | — | — | 6.9 | 7800 | 1.81 | 79 |
| A-30 | — | 88.9 | — | — | — | — | — | 11.1 | — | — | — | 6.5 | 6400 | 1.75 | 82 |
| A-31 | — | 100.0 | — | — | — | — | — | — | — | — | — | 6.3 | 6700 | 1.81 | 86 |

Examples 1 to 47 and Comparative Examples 1 to 4

The immersion upper layer film composition was prepared by using the resins (A-1) to (A-32).

A solution was prepared by dissolving 1 g of the resin shown in Table 1 and Table 2 in 99 g of the solvent shown in Table 3 with stirring for two hours. The solution was filtered through a membrane filter with a pore size of 200 nm. In Table 2, IPA represents isopropanol; n-BuOH represents normal butanol; t-BuOH represents tertiary butanol; PGME represents propylene glycol monomethyl ether; PG represents propylene glycol; MEK represents methyl ethyl ketone; 3M2P represents 3-methyl-2-pentanol; and 4M2P represents 4-methyl-2-pentanol. In Table 3, the ratio of the mixed-solvent refers to the ratio of weight.

Evaluation of the immersion upper layer film composition was carried out as follows. The results are shown in Table 3.

(1) Evaluation Method of Solubility

In the Example 1 to 28 and Comparative Examples 1 to 4, 1 g of the resin for the upper layer film was dissolved in 99 g of solvent shown in Table 3, and the mixture was stirred for three hours at rotational speed of 100 rpm using Three-One Motor. When the mixture became uniformly-dispersed, it was determined that the solubility was good ("Good"). When the mixture was caused undissolved matter or white turbidity, it was determined that the solubility was poor ("Bad").

In the Example 29 to 47, necessary solvent requirements was added to the resin solution in the same manner as preparation of the evaluation solution, and the mixture was stirred for three hours at rotational speed of 100 rpm using Three-One Motor. When the mixture became uniformly-dispersed, it was determined that the solubility was good ("Good"). When the mixture was caused undissolved matter or white turbidity, it was determined that the solubility was poor ("Bad").

(2) Evaluation Method of Removal Performance of Upper Layer Film

The upper layer film was applied to an eight-inch silicon wafer by spin coating in the Clean Track ("ACT-8", manufactured by Tokyo Electron Ltd.). After performing PB (90° C., 60 sec), a coating film with a thickness of 32 nm was formed. The thickness was measured using the LAMBDA ACE ("VM-90", manufactured by Dainippon Screen MFG. Co., LTD). The coating film was then subjected to puddle development (developer component: 2.38 wt % TMAH aqueous solution) using the CLEAN TRACK ACT8 (60 sec), spin-dried, and wafer surface were observed. When the wafer was developed with no residues, it was determined that the removal performance was good ("Good"). When the residues were observed, it was determined that the removal performance was poor ("Bad").

(3) Evaluation Method of Intermixing

The JSR ArF AR1221J was applied to a HMDS-treated (100° C., 60 sec) eight-inch silicon wafer by spin coating. The immersion upper layer film composition was applied to the wafer by spin coating a PB (90° C., 60 sec) to form a coating film with a thickness of 32 nm. Then, the wafer was discharged ultrapure water to the wafer using an rinse nozzle of the CLEAN TRACK ACT8 (60 sec), spin-dried at 4000 rpm for 15 seconds, subjected to puddle development using an LD nozzle of the CLEAN TRACK ACT8 (60 sec), and removed the upper layer film. 2.38% of TMAH aqueous solution was used as the developer in this development process. The immersion upper layer film was removed in the development process, but the resist film was unexposed and remained on the wafer. The thickness was measured using the LAMBDA ACE ("VM-90", manufactured by Dainippon Screen MFG. Co., LTD) around the process. When the range of a change of the resist thickness was 0.5% or less, there was no intermixing between the resist film and the immersion upper layer film ("Good"). When the range of a change of the resist thickness was 0.5% or more, it was indicated as "Bad".

(4) Water-stable Evaluation of Immersion Upper Layer Film Composition (Water Resistance)

The immersion upper layer film composition was applied to an eight-inch silicon wafer by spin coating. After performing PB (90° C., 60 sec), a coating film with a thickness of 30 nm was formed. The thickness was measured using the LAMBDA ACE "VM-90". The wafer of the above substrate was then discharged ultrapure water to the wafer using a rinse nozzle of the CLEAN TRACK ACT8 (60 sec), spin-dried at 4000 rpm for 15 seconds, and the thickness of the substrate was again measured. When the amount of decrease in the thickness was 0.5% or less of the initial thickness, it was determined that the coating film is stable ("Good"). When the amount of decrease in the thickness was 0.5% or more of the initial thickness, it was determined that the coating film is not stable ("Bad").

(5) Patterning Evaluation (5-1) Evaluation Method of Resist Pattern (ArF Exposure)

The evaluation method of resist patterning using the upper layer film is described below.

A lower-layer anti-reflective film ARC29 (manufactured by Brewer Science) was applied to an eight-inch silicon wafer by spin coating a PB (90° C., 60 sec) to form a coating with a thickness of 77 nm. Then, patterning was performed by using JSR ArF AR1221J. The AR1221J was applied to the wafer by spin coating a PB (130° C., 90 sec) to form a coating film with a thickness of 205 nm. After performing PB, the upper layer film was applied to the wafer by spin coating a PB (90° C., 60 sec), a coating film with a thickness of 32 nm was formed. The wafer was exposed (dose: 30 mJ/cm$^2$) using an ArF projection exposure device S306C (manufactured by Nikon Corporation) under optical conditions of NA: 0.78, sigma: 0.85, and ⅔ Ann. The wafer was discharged ultrapure water to the wafer using a rinse nozzle of the CLEAN TRACK ACT8 (60 sec), and spin-dried at 4000 rpm for 15 seconds. Then the wafer was subjected to PEB (130° C., 90 sec) using a CLEAN TRACK ACT8 hot plate, subjected to puddle development using an LD nozzle of the CLEAN TRACK ACT8 (60 sec), rinsed with ultrapure water, and spin-dried at 4000 rpm for 15 seconds.

The patterns of the substrates corresponding to the 90 nm line/90 nm space mask pattern were observed using a scanning electron microscope S-9360 (manufactured by Hitachi Instruments Service Co., Ltd.). A case where the resist had no pattern collapse, development residues corresponding to the space and pattern waves, and an excellent resist pattern was obtained for the developed substrates was indicated as "Good", and a case where an excellent pattern was not obtained was indicated as "Bad". "-" indicates that the pattern evaluation was not conducted.

(5-2) Evaluation Method of Resist Pattern (KrF Exposure)

The evaluation method of the pattern obtained by applying the upper layer film of the present invention on the ArF resist and being exposed by KrF (wavelength: 248 nm) is described below.

A lower-layer anti-reflective film DUV42 (manufactured by Nissan Chemical Industries, Ltd.) was applied to an eight-inch silicon wafer by spin coating a PB (205° C., 60 sec) to form a coating with a thickness of 60 nm. Then, patterning was performed by using JSR ArF AR1221J. The AR1221J was applied to the wafer by spin coating a PB (130° C., 90 sec) to form a coating film with a thickness of 205 nm. After performing PB, the upper layer film was applied to the wafer by spin coating a PB (90° C., 60 sec), a coating film with a thickness of 40 nm was formed. The wafer was exposed (dose: 100 mJ/cm$^2$) using a KrF projection exposure device S203B (manufactured by Nikon Corporation) under optical conditions of NA: 0.68, sigma: 0.75, and ⅔ Ann. The wafer was discharged ultrapure water to the wafer using a rinse nozzle of the CLEAN TRACK ACT8 (60 sec), and spin-dried at 4000 rpm for 15 seconds. Then the wafer was subjected to PEB (130° C., 90 sec) using a CLEAN TRACK ACT8 hot plate, subjected to puddle development using an LD nozzle of the CLEAN TRACK ACT8 (60 sec), rinsed with ultrapure water, and spin-dried at 4000 rpm for 15 seconds.

The patterns of the substrates corresponding to the 150 nm line/150 nm space mask pattern were observed using a scanning electron microscope S-9360 (manufactured by Hitachi Instruments Service Co., Ltd.). A case where the resist had no pattern collapse, development residues corresponding to the space and pattern waves, and an excellent resist pattern was obtained for the developed substrates was indicated as "Good", and a case where an excellent pattern was not obtained was indicated as "Bad". "-" indicates that the pattern evaluation was not conducted.

TABLE 3

| | Resin | solvent | Solubility | Removal performance | Intermixing | Water resistance | Patterning KrF | Patterning ArF |
|---|---|---|---|---|---|---|---|---|
| Example | | | | | | | | |
| 1 | A-1 | IPA | Good | Good | Good | Good | — | Good |
| 2 | A-2 | IPA | Good | Good | Good | Good | — | Good |
| 3 | A-2 | n-BuOH | Good | Good | Good | Good | — | Good |
| 4 | A-2 | t-BuOH | Good | Good | Good | Good | — | Good |
| 5 | A-2 | IPA/PGME = 95/5 | Good | Good | Good | Good | — | Good |
| 6 | A-3 | IPA | Good | Good | Good | Good | — | Good |
| 7 | A-4 | IPA | Good | Good | Good | Good | — | Good |
| 8 | A-5 | IPA | Good | Good | Good | Good | — | Good |
| 9 | A-6 | IPA | Good | Good | Good | Good | — | Good |
| 10 | A-6 | n-BuOH | Good | Good | Good | Good | — | Good |
| 11 | A-6 | IPA/PGME = 95/5 | Good | Good | Good | Good | — | Good |
| 12 | A-7 | IPA | Good | Good | Good | Good | — | Good |
| 13 | A-8 | IPA | Good | Good | Good | Good | Good | — |
| 14 | A-1 | 4M2P | Good | Good | Good | Good | — | Good |
| 15 | A-1 | 3M2P | Good | Good | Good | Good | — | Good |
| 16 | A-9 | n-BuOH | Good | Good | Good | Good | — | Good |
| 17 | A-10 | n-BuOH | Good | Good | Good | Good | — | Good |
| 18 | A-11 | 4M2P | Good | Good | Good | Good | — | Good |
| 19 | A-12 | n-BuOH | Good | Good | Good | Good | — | Good |
| 20 | A-13 | n-BuOH | Good | Good | Good | Good | — | Good |
| 21 | A-13 | 4M2P | Good | Good | Good | Good | — | Good |
| 22 | A-14 | n-BuOH | Good | Good | Good | Good | — | Good |
| 23 | A-14 | n-BuOH/4M2P = 30/70 | Good | Good | Good | Good | — | Good |
| 24 | A-15 | n-BuOH | Good | Good | Good | Good | — | Good |
| 25 | A-16 | n-BuOH | Good | Good | Good | Good | — | Good |
| 26 | A-17 | 4M2P | Good | Good | Good | Good | — | Good |
| 27 | A-17 | n-BuOH | Good | Good | Good | Good | — | Good |
| 28 | A-18 | n-BuOH | Good | Good | Good | Good | — | Good |
| 29 | A-19 | n-BuOH | Good | Good | Good | Good | — | Good |
| 30 | A-19 | n-BuOH/4M2P = 50/50 | Good | Good | Good | Good | — | Good |
| 31 | A-20 | n-BuOH | Good | Good | Good | Good | — | Good |
| 32 | A-21 | n-BuOH | Good | Good | Good | Good | — | Good |
| 33 | A-22 | n-BuOH | Good | Good | Good | Good | — | Good |
| 34 | A-23 | n-BuOH | Good | Good | Good | Good | — | Good |
| 35 | A-23 | 4M2P | Good | Good | Good | Good | — | Good |
| 36 | A-24 | 4M2P | Good | Good | Good | Good | — | Good |
| 37 | A-24 | n-BuOH | Good | Good | Good | Good | — | Good |
| 38 | A-25 | n-BuOH | Good | Good | Good | Good | — | Good |
| 39 | A-25 | 4M2P | Good | Good | Good | Good | — | Good |
| 40 | A-26 | 4M2P | Good | Good | Good | Good | — | Good |
| 41 | A-26 | n-BuOH/4M2P = 50/50 | Good | Good | Good | Good | — | Good |
| 42 | A-27 | n-BuOH | Good | Good | Good | Good | — | Good |
| 43 | A-28 | n-BuOH | Good | Good | Good | Good | — | Good |
| 44 | A-29 | n-BuOH/4M2P = 50/50 | Good | Good | Good | Good | — | Good |
| 45 | A-30 | n-BuOH | Good | Good | Good | Good | — | Good |
| 46 | A-31 | n-BuOH | Good | Good | Good | Good | — | Good |
| 47 | A-31 | n-BuOH/4M2P = 70/30 | Good | Good | Good | Good | — | Good |
| Comparative Example | | | | | | | | |
| 1 | A-1 | PGME | Good | Good | Bad | Good | — | — |
| 2 | A-2 | PG | Good | Good | Good | Bad | — | — |
| 3 | A-3 | MEK | Good | Good | Bad | Good | — | — |
| 4 | A-32 | IPA | Good | Bad | Good | Good | — | — |

Industrial Applicability

Since the composition to form a immersion upper layer film of the present invention comprises a resin forming a water-stable film during irradiation and being dissolved in a subsequent developer, and a solvent containing a monovalent alcohol having 6 or less carbon atoms, the composition protects a lens and a photoresist film during immersion exposure and can form a resist pattern exhibits an excellent resolution, developability, and the like. The composition can be suitably used in the field of microfabrication represented by the manufacture of semiconductor devices which are expected to become more and more miniaturized in the future.

The invention claimed is:

1. An immersion upper layer film composition applied to coat on a photoresist film when using an immersion exposure device which is irradiated through water provided between a lens and the photoresist film, and the composition comprising a resin forming a water-stable film during irradiation and being dissolved in a subsequent developer, and a solvent containing a monovalent alcohol having 6 or less carbon atoms, and the resin includes a recurring unit having an alcoholic hydroxyl group on a side chain containing a fluoroalkyl group on at least the carbon atom of α-position.

2. The immersion upper layer film composition according to claim 1, wherein the recurring unit having an alcoholic hydroxyl group on the side chain containing the fluoroalkyl group on at least the carbon atom of α-position comprises a recurring unit of the following formula (1),

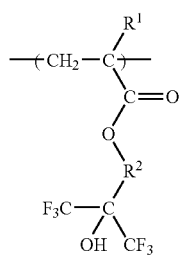

(1)

wherein $R^1$ represents a hydrogen atom or a methyl group, and $R^2$ represents an organic group.

3. The immersion upper layer film composition according to claim 2, wherein the organic group is a divalent hydrocarbon group.

4. The immersion upper layer film composition according to claim 3, wherein the divalent hydrocarbon group consists of an alkylene group having 1 to 4 carbon atoms and an alicyclic hydrocarbon group, the alkylene group being located between the alicyclic hydrocarbon group and a bis-trifluoromethyl-hydroxy-methyl group.

5. The immersion upper layer film composition according to claim 3, wherein the divalent hydrocarbon group is a hydrocarbon group having a 2,5-norbornylene group, or a 1,2-propylene group.

6. The immersion upper layer film composition according to claim 1, wherein the resin is an alkali-soluble resin dissolved in an alkaline aqueous solution during development using the alkaline aqueous solution.

7. The immersion upper layer film composition according to claim 1, wherein the solvent containing a monovalent alcohol having 6 or less carbon atoms is a solvent containing at least 65 wt% or more of the monovalent alcohol having 6 or less carbon atoms.

8. The immersion upper layer film composition according to claim 7, wherein the monovalent alcohol having 6 or less carbon atoms is at least one monovalent alcohol selected from 2-propanol, 1-butanol, 2-butanol, 2-methyl-2-propanol, 3-methyl-2-pentanol and 4-methyl-2-pentanol.

9. A method to form a photoresist pattern comprising the steps of; forming a photoresist film by applying the photoresist on a substrate, forming an upper layer film on the photoresist film, and forming a resist pattern by exposure with radiation through a predetermined mask pattern with water and development, wherein the process of forming the upper layer film is the process by using the immersion upper layer film composition according to claim 1.

* * * * *